(12) United States Patent
Kuramoto et al.

(10) Patent No.: US 9,331,251 B2
(45) Date of Patent: May 3, 2016

(54) LIGHT EMITTING DEVICE

(71) Applicant: Nichia Corporation, Anan (JP)

(72) Inventors: Masafumi Kuramoto, Tokushima (JP); Shuji Shioji, Anan (JP); Katsuyuki Tsunano, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/555,197

(22) Filed: Nov. 26, 2014

(65) Prior Publication Data
US 2015/0155456 A1 Jun. 4, 2015

(30) Foreign Application Priority Data
Nov. 29, 2013 (JP) .................................. 2013-248004

(51) Int. Cl.
H01L 29/22 (2006.01)
H01L 33/46 (2010.01)

(52) U.S. Cl.
CPC ....... *H01L 33/46* (2013.01); *H01L 2224/32245* (2013.01); *H01L 2224/45144* (2013.01); *H01L 2224/48091* (2013.01); *H01L 2224/48247* (2013.01); *H01L 2224/73265* (2013.01)

(58) Field of Classification Search
CPC ....... H01L 33/10; H01L 33/46; H01L 33/405; H01L 33/60; H01L 33/62
USPC .................. 257/81, 98, 99, 100, 101
See application file for complete search history.

(56) References Cited

U.S. PATENT DOCUMENTS

2010/0127369 A1* 5/2010 Seki et al. .................... 257/676
2014/0342104 A1 11/2014 Tauchi

FOREIGN PATENT DOCUMENTS

| JP | 2010-153825 | 7/2010 |
| JP | 2011-222603 | 11/2011 |
| JP | 2012-062564 | 3/2012 |
| JP | 2013-151735 | 8/2013 |

* cited by examiner

*Primary Examiner* — Hung Vu
(74) *Attorney, Agent, or Firm* — Foley & Lardner LLP

(57) ABSTRACT

To provide a light emitting device that can suppress the increase in pits and projections caused by the thermal history of the reflective film on the surface of the reflective film used in the light emitting device, the light emitting device includes: a light emitting element; and a reflective film for reflecting light from the light emitting element, in which the reflective film contains silver as a principal component, and nanoparticles of an oxide.

21 Claims, 4 Drawing Sheets

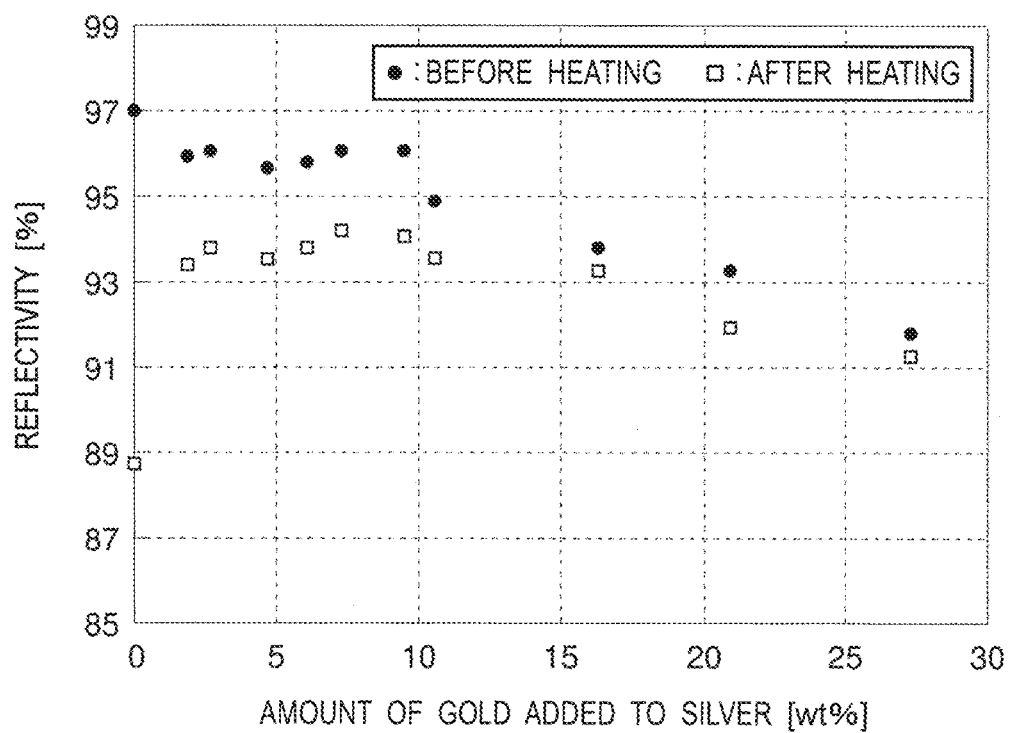

LIGHT EMITTING DEVICE

CROSS REFERENCE TO RELATED APPLICATIONS

The present application is related to and claims the priority benefit of Japanese Patent Application No. 2013-248004 filed on Nov. 29, 2013, which is incorporated herein by reference in its entirety.

BACKGROUND OF THE INVENTION

1. Field of the Invention

The disclosure relates to a light emitting device.

2. Description of the Related Art

As disclosed in JP 2011-222603 A, for example, there has hitherto been employed a lead frame with a reflective film of Ag or Ag alloy plating formed on its surface in light emitting devices using a light emitting element as a light source such as a light emitting diode (LED), in order to enhance the light extraction efficiency.

The light emitting device using such a reflective film, however, has the drawback that silver crystal grains grow due to a thermal history of an assembly process of the light emitting device to increase pits and projections on its surface, reducing a reflectivity of the reflective film, resulting in reduction in light extraction efficiency.

JP 2010-153825 A discloses a lead frame including a main body made of Cu or a Cu alloy, and an Ag plating film formed on the main body with nanoparticles arranged between Ag crystal grains of the Ag plating film. The Ag plating film is not considered as the reflective film for the light emitting device.

SUMMARY OF THE INVENTION

Accordingly, it is an object of the present invention to provide a light emitting device that can suppress the increase in pits and projections caused by the thermal history of the reflective film on the surface of the reflective film used in the light emitting device, thereby suppressing the reduction in light extraction efficiency due to the thermal history.

According to one embodiment of the present invention, a light emitting device includes: a light emitting element; and a reflective film for reflecting light from the light emitting element, in which the reflective film contains silver as a principal component, and nanoparticles of an oxide.

The embodiment of the present invention can provide a light emitting device that can reduce the increase in pits and projections on the surface of a reflective film due to the thermal history by the presence of nanoparticles in the reflective film, thereby suppressing the reduction in light extraction efficiency.

BRIEF DESCRIPTION OF THE DRAWINGS

FIG. 2 is a graph showing the relationship between the amount of gold added to a silver reflective film, and the reflectivity of the silver reflective film.

DETAILED DESCRIPTION OF THE PREFERRED EMBODIMENTS

Preferred embodiments of the present invention will be described below with reference to the accompanying drawings. Note that a reflective film for a light emitting device, a lead frame, a wiring substrate, a wire, and the light emitting device to be mentioned later are intended to embody the technical idea of the present invention, and not to restrict the scope of the present invention to the following embodiments unless otherwise specified. In some drawings, the sizes or positional relationships of members are emphasized to make it easy to understand.

First Embodiment

Figure 1A:
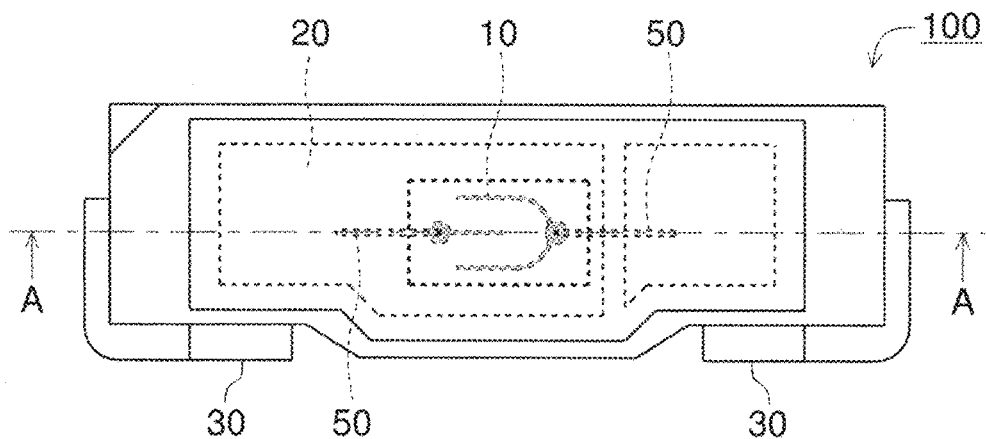
FIG. 1A is a schematic top view of a light emitting device according to one embodiment of the present invention.
Figure 1B:
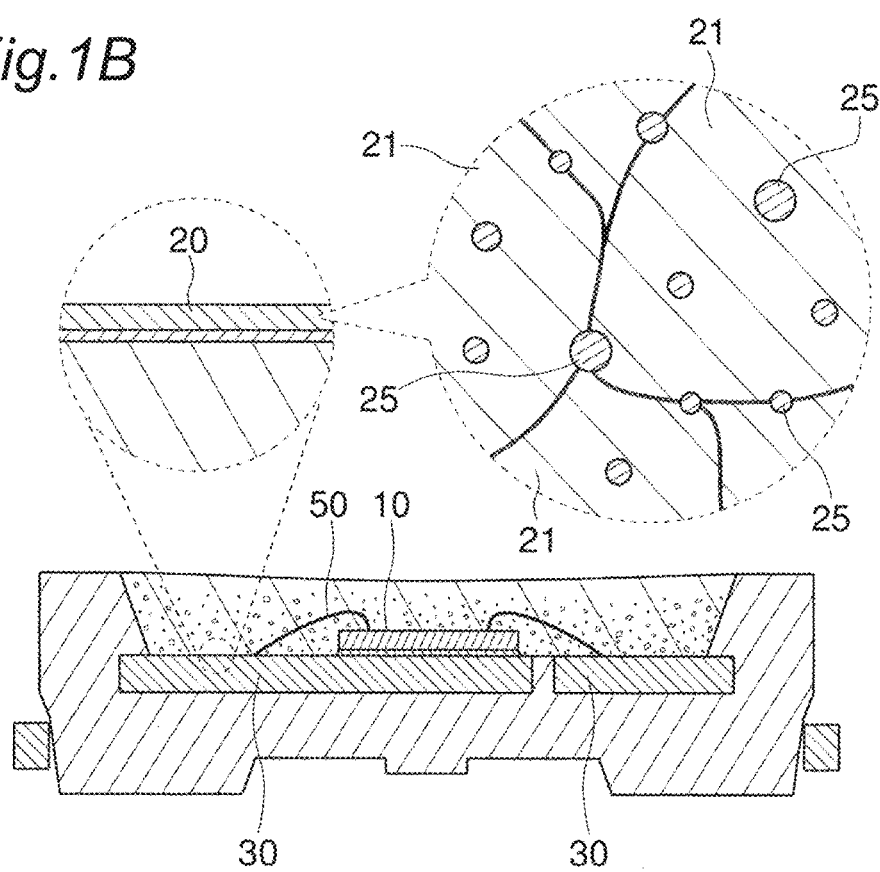
FIG. 1B is a schematic cross-sectional view taken along the line A-A of FIG. 1A.

FIG. 1A shows a schematic top view of a light emitting device according to a first embodiment of the present invention, and FIG. 1B is a schematic cross-sectional view taken along the line A-A of FIG. 1A. As shown in FIGS. 1A and 1B, a light emitting device 100 according to the first embodiment includes a light emitting element 10, and a reflective film 20 that reflects light from the light emitting element 10.

More specifically, the light emitting device 100 is a surface mount type LED. The light emitting device 100 includes the light emitting element 10, a package with a recessed portion for accommodating therein the light emitting element 10, and a sealing member provided in the recessed portion to cover the light emitting element 10. The package includes a pair of positive and negative lead electrodes 30, and a resin molding body that integrally holds the lead electrodes 30. A part of the bottom surface of the recessed portion of the package is constituted by the surfaces of the lead electrodes 30. The light emitting element 10 is a LED element, bonded to the bottom surface of the recessed portion of the package by an adhesive, and connected to the lead electrodes 30 via wires 50. The sealing member may contain a phosphor, a filler, and the like.

The reflective film 20 is used for such a light emitting device. In the first embodiment, the reflective film 20 is provided on the surface of the lead electrode 30. The reflective film 20 contains silver as a principal component. Further, the reflective film 20 contains nanoparticles 25 of an oxide. In the present specification, the term "on" refers to not only direct contact but also indirect contact.

The oxide forming the nanoparticle 25 is preferably at least one material selected from the group consisting of silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, tin oxide, ITO (Indium Tin Oxide), IZO (Indium Zinc Oxide), AZO (Al-doped ZnO), GZO (Ga-doped ZnO), and FTO (Fe-doped $SnO_2$). Among them, silicon oxide, aluminum oxide, zirconium oxide, and titanium oxide are easily available, and relatively inexpensive. The use of the conductive oxide can suppress the increase in electric resistance of the reflective film 20. Further, preferably, the use of the translucent oxide selected from among the above-mentioned materials can suppress the absorption of the light in the oxide existing near the surface of the reflective film 20, thereby enhancing the light extraction efficiency.

In this way, the presence of the nanoparticles 25 in the reflective film 20 exhibits a pinning effect, which can suppress the growth of the silver crystal grains 21. This can reduce the increase in pits and projections on the surface of the reflective film 20 due to the thermal history in the assembly process of the light emitting device, thereby reducing the diffuse reflection of the light while keeping a mirror surface of the reflective film 20. Thus, the reflective film 20 can serve as a reflective film having a high reflectivity, thereby producing the light emitting device with excellent light extraction efficiency.

Note that there is proposed another means for suppressing the increase in pits and projections on the surface of the silver reflective film due to the thermal history, which involves adding a different kind of metal to silver for the purpose of exhibiting a solute drag effect. However, the different kind of metal has a relatively high light-absorbing property, which might cause a non-negligible loss of light considering light scattering within the light emitting device. However, the material constituting the nanoparticle 25 in this embodiment has excellent translucency, and thus can excessively reduce the loss of light.

Preferred embodiment of the reflective film 20 will be described below.

As shown in FIG. 1, the nanoparticle 25 preferably exists at least in a crystal grain boundary of silver. The present of the nanoparticles 25 in the crystal grain boundaries of silver can easily suppress the movement of the grain boundaries by the pinning effect, thereby effectively inhibiting the growth of the silver crystal grains 21. Thus, metal atoms made of copper or the like and existing in an underlayer of the reflective film 20 can be prevented from being diffused into the crystal grain boundary of silver of the reflective film 20, thereby suppressing the formation of a colored oxide film on the surface of the reflective film 20. Further, the invading of oxygen from the air into the reflective film 20 by the grain boundary diffusion can be suppressed, thereby preventing the oxidation of metal of the underlayer, which can keep the adhesion between the reflective film 20 and the metal underlayer for a long time. Thus, even after the assembly process or continuous driving of the light emitting device, the reflective film 20 can keep the high light extraction efficiency and suppress the interlayer peeling from the metal underlayer. As a result, the reflective film with excellent reliability can be obtained. The reflective film 20 can obtain these effects at low cost, and can also simplify the layer structure on and under the reflective film, as compared to the case in which a barrier layer is formed in between the metal underlayer and the reflective film.

An average particle diameter (D50) of the nanoparticle 25 is preferably 0.1 nm or more and 100 nm or less, and more preferably 0.1 nm or more and less than 10 nm. In this way, as the particle diameter of the nanoparticle 25 is smaller, a greater number of nanoparticles 25 can be dispersed into the reflective film 20 even by addition of a small amount of the nanoparticles, thereby easily inhibiting the growth of the silver crystal grains 21. Here, the average particle diameter as used in the present specification means an average particle diameter determined by an image analysis method defined based on JIS Z 8827-1:2008.

The content of the nanoparticles 25 in the reflective film 20 is preferably 5% by weight or less in view of reflectivity (initial reflectivity) of the reflective film 20. On the other hand, the content of the nanoparticles 25 in the reflective film 20 has only to be 0% by weight or more, and preferably 0.2% by weight or more in view of inhibiting the crystal growth of silver. More preferably, the content of the nanoparticles 25 in the reflective film 20 is 1.5% by weight or more in view of inhibiting the crystal growth of silver, while 4% by weight or less in view of reflectivity (initial reflectivity) of the reflective film 20.

The shapes of the nanoparticle 25 may include, for example, a spherical shape, an irregular crushed shape, a needle-like shape, a columnar shape, a plate-like shape (including a scale-like shape), a fiber-like shape, a dendritic shape, and the like. Among them, the spherical nanoparticles 25 permits the speedy extraction of light therefrom while suppressing the total reflection, even though the light propagates through the relatively large nanoparticles 25 having a size that interferes with visible light. As a result, the reflective film 20 with excellent reflectivity can be easily obtained.

Either or both of a selenium compound and a sulfur compound is preferably attached to the nanoparticle 25. The selenium compound and the sulfur compound have a high chemical affinity for silver, and thus can enhance the adhesion between the nanoparticle 25 and the silver. When forming a silver film by wet plating, such as electrolytic silver plating or electroless silver plating, these compounds allow the nanoparticles 25 to be easily taken into the reflective film 20.

Silver forms not only a solid solution and an intermetallic compound with impurities of a different kind of metal, but also a compound with non-metallic impurities made of, e.g., selenium or sulfur. These impurities promote the phenomenon of inhibition of the crystal growth, which is called the pinning effect or solute drag effect, but might reduce reflectivity of the silver reflective film. Especially, in the light emitting device containing a light diffusion component, such as phosphor, the influence of pits and projections on the reflective film and light absorption by it is increased by the light diffusion, causing the non-negligible loss of light. Thus, in order to gain the same level of reflectivity as that of pure silver, it is preferable to maintain a certain high degree of purity of silver. The loss of light due to the light absorption is varied depending on chemical species of impurities even when the amount of each species of impurity added is the same. However, gold is a non-oxidizing metal that can ensure the wire bonding mount, and is thus an only impurity that can be added in a great amount. By taking gold as one example, the maximum amount of impurity added can be substantially defined. FIG. 2 is a graph showing the relationship between the amount of gold added to the silver reflective film, and the reflectivity of the silver reflective film. More specifically, FIG. 2 is a graph illustrating the relationship between the amount of gold added to the silver reflective film formed by sputtering and the reflectivity of the silver reflective film before and after a heat treatment. The conditions for the heat treatment are as follows: 250° C. and 2 hours in the atmosphere. As can be seen from FIG. 2, the purity of silver is preferably 91% or more. Further, in order to gain the same level of reflectivity as that of pure silver, the purity of silver is more preferably 99% or more. Note that the purity of silver indicates a rate of silver except for impurities that form any compound by being alloyed or reacted with silver. The nanoparticle 25 is not considered to belong to such an impurity.

Silver is a polycrystal. As the crystal grain is growing up sterically, the surface of silver becomes rough and the diffuse reflection is increased, so that the silver seems to be whitened as observed visually. Even the high-pure silver slightly absorbs light, and thus its reflectivity is reduced because of the increase in light absorption due to the diffuse reflection. By decreasing the average particle diameter of silver to such a degree that hardly interferes with visible light, it is possible to allow the surface of the silver reflective film to be a mirror surface or a surface with a glossiness of 1.5 or more. Specifically, this can be achieved by decreasing the average particle diameter of silver to less than 50 nm that is largely below one fourth of the shortest wavelength of the visible light, namely, 380 nm. For example, in the electrolytic silver plating, however, in order to decrease the average particle diameter, it is necessary to suppress the crystallinity by increasing the concentration of impurities in the silver reflective film. As the concentration of impurities is increased, the light absorption is enhanced. In this case, even though the average particle diameter is decreased to form the mirror surface, that is, the surface with high glossiness, the reflectivity is reduced. Sputtering which is economically inefficient as compared to the electrolytic plating can achieve this state only under a condition that is not economically competitive. For this reason, the average particle diameter of silver is preferably 50 nm or more and 1.0 µm or less, and more preferably 50 nm or more and 0.5 µm or less.

Second Embodiment

Figure 3A:
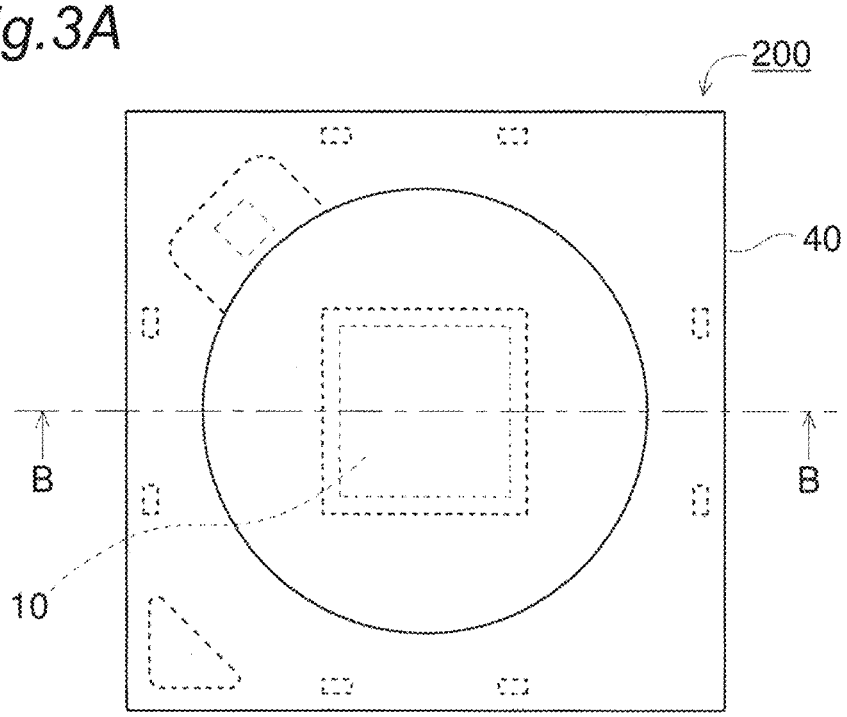
FIG. 3A is a schematic top view of a light emitting device according to another embodiment of the present invention.
Figure 3B:
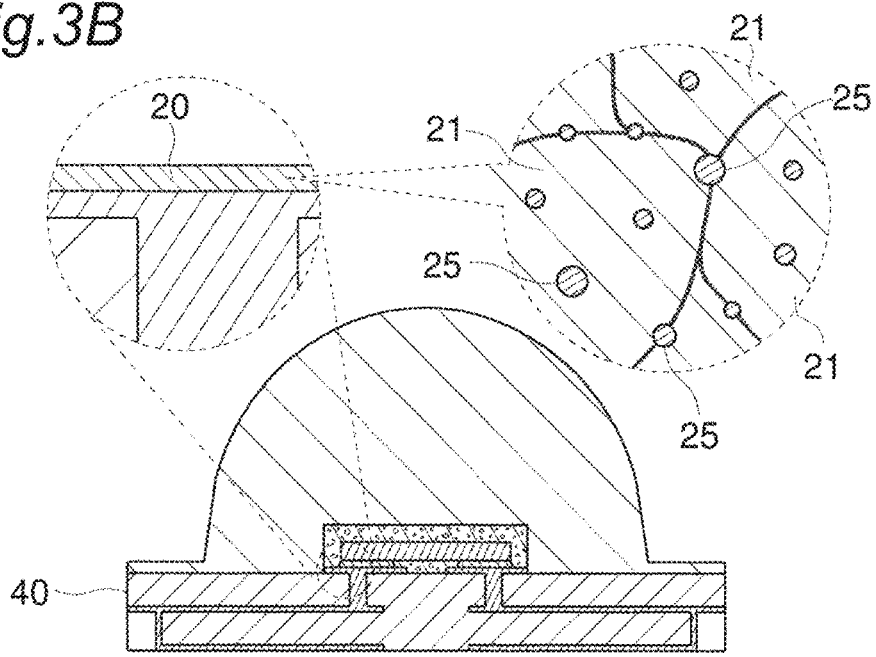
FIG. 3B is a schematic cross-sectional view taken along the line B-B of FIG. 3A.

FIG. 3A shows a schematic top view of a light emitting device according to a second embodiment of the present invention, and FIG. 3B is a schematic cross-sectional view taken along the line B-B of FIG. 3A. As shown in FIGS. 3A and 3B, a light emitting device 200 according to the second embodiment includes the light emitting element 10, and the reflective film 20 that reflects light from the light emitting element 10.

More specifically, the light emitting device 200 is a surface mount type LED. The light emitting device 200 includes the light emitting element 10, a wiring substrate 40 on which the light emitting element 10 is mounted, and a sealing member provided on the wiring substrate 40 to cover the light emitting element 10. The light emitting elements 10 may be mounted on the wiring substrate 40 with a bonding member intervened therebetween. The wiring substrate 40 includes a pair of positive and negative wirings, and a base body for holding the wirings. The light emitting element 10 is a LED element, and is connected to the wirings of the wiring substrate 40 with a conductive adhesive. The sealing member may contain a phosphor, a filler, and the like.

The reflective film 20 is also used for such a light emitting device. In the second embodiment, the reflective film 20 is provided on the surface of the wiring on the wiring substrate 40. The reflective film 20 also contains silver as a principal component. The reflective film 20 contains nanoparticles 25 of an oxide. The reflective film 20 has only to be formed on the surface of the wiring substrate 40 as well as the surface of the wiring, and thus may not necessarily function electrically.

Thus, the light emitting device 200 and reflective film 20 of the wiring substrate 40 can also exhibit the above-mentioned effects, like the light emitting device 100 and lead electrode 30 of the first embodiment.

The components of the light emitting device in the present invention will be described below.

(Light Emitting Device)

The light emitting device may be of a lead insertion type, but is preferably of a surface mount type. The invention exhibits the significant effects when applied to the surface mount type light emitting device as this type of light emitting device tends to cause the growth of silver crystal grains due to the severe thermal history, including reflow soldering and the like.

(Light Emitting Element 10)

The light emitting element can use the semiconductor light emitting element, such as a LED element. The light emitting element may be an element structure configured of various semiconductors and provided with a pair of positive and negative electrodes. In particular, the light emitting element preferably contains a nitride semiconductor ($In_XAl_YGa_{1-X-Y}N$, $0 \leq X$, $0 \leq Y$, $X+Y \leq 1$) that can effectively excite the phosphor. In addition, the light emitting element may contain a gallium arsenide semiconductor, or a gallium phosphide semiconductor. The light emitting element with a pair of positive and negative electrodes provided on the same surface side is face-up mounted by connecting the respective electrodes to a lead electrode or a wiring via wires, or face-down (flip-chip) mounted by connecting the respective electrodes to a lead electrode or a wiring by a conductive adhesive. In a light emitting element having a pair of positive and negative electrodes respectively on opposed surfaces thereof, a lower surface electrode is bonded to the lead electrode or wiring by the conductive adhesive, and an upper surface electrode is connected to the lead electrode or wiring by the wires. The number of light emitting elements mounted on one light emitting device may be one or plural. The light emitting elements can be connected in series or in parallel.

(Reflective Film 20)

The reflective film can be formed by electrolytic plating, electroless plating, sputtering, vapor deposition, or the like. The thickness of the reflective film can be any value arbitrarily selected and, for example, 0.1 µm or more and 5.0 µm or less, and preferably 0.2 µm or more and 3.0 µm or less.

(Lead Electrode 30)

Materials suitable for use in the lead electrode can be metal that exhibits conductivity by being connected to the light emitting element. Specifically, the materials include copper, aluminum, gold, silver, tungsten, iron, nickel, cobalt, molybdenum, or an alloy thereof, phosphor bronze, iron-containing copper, and the like. The lead electrode may be configured of a laminate of these metals, but is preferably a single layer of one of theses metals because of the simpleness of the structure. In particular, a copper alloy containing copper as a principal component is preferably used. The thickness of the lead electrode can be any value arbitrarily selected and, for example, 0.1 mm or more and 1 mm or less, and preferably 0.2 mm or more and 0.4 mm or less.

(Lead Frame)

The lead frame is a plate-like member in which lead electrodes 30 for the plural light emitting devices are arranged in a matrix and connected together by a suspension lead. In other words, the lead electrodes 30 is obtained as a part of each light emitting device by singulating the lead frame by cutting and forming. The lead frame includes, as the base body, a metal plate made of the above-mentioned material and which undergoes various processes, including pressing, etching, rolling, and the like. The reflective film 20 on the lead electrode 30 is normally formed in the state of the lead frame.

(Molded Body)

A molded body is integrally formed with the lead electrodes to thereby configure a package. Base material for the molded body can include a thermosetting resin, such as an epoxy resin, a silicone resin, a modified resin thereof, or a hybrid resin, or a thermoplastic resin, such as an aliphatic polyamide resin, a semi-aromatic polyamide resin, or polycyclohexane terephthalate. The molded body may contain powder or fiber of, e.g., glass, calcium silicate, calcium titanate, titanium oxide, or carbon black, as a filler or coloring pigment into the base material.

(Wiring Substrate 40)

The base body of the wiring substrate is preferably electrically insulating, but can be electrically insulated from the wiring via the insulating film or the like, even though the base body is conductive itself. Materials of the base body for the wiring substrate can include ceramics, such as aluminum oxide, aluminum nitride, or a mixture thereof, metal, such as copper, iron, nickel, chromium, aluminum, silver, gold, titanium, or an alloy thereof, resin, such as epoxy resin, BT resin, polyimide resin, or a fiber-reinforced resin (reinforced material being glass). The wiring substrate can be a rigid substrate, or a deformable substrate (flexible substrate) that can be set depending on the material or thickness of the base body. The wiring substrate is not limited to a flat plate, but can also have the form of a recessed portion, like the package.

The wiring is formed on at least an upper surface of the base body, and may be formed inside, and on the lower surface and side surfaces of the base body. The wiring may include a land (die pad) portion with the light emitting element bonded thereto, a terminal for external connection, and a withdrawn wiring portion for connection between the land and terminal. Material for the wiring can include copper, nickel, palladium, tungsten, chrome, titanium, aluminum, silver, gold, or an alloy thereof. Particularly, copper or a copper alloy is preferable in terms of heat dissipation. These wirings can be formed by electrolytic plating, electroless plating, sputtering, vapor deposition, printing, coating, a co-fire method, a post-fire method, and the like.

Note that the wiring substrate may include the form of a composite substrate constructed of a plurality of wiring substrates 40 for the light emitting device that are arranged in a matrix and connected together.

(Sealing Member)

The base material of the sealing member has the electric insulation, and may transmit light emitted from the light emitting element (preferably, transmittance of 70% or more). Specifically, the base materials can include a silicone resin, an epoxy resin, or a modified resin thereof, and a hybrid resin. Among them, the silicone resin or a modified resin thereof is preferable as this resin has excellent resistance to heat and light, and has a little volume contraction after solidification of the resin. The filler contained in the sealing member can include silica (silicon oxide) or the like.

(Phosphor)

The phosphor absorbs at least a part of a primary light emitted from the light emitting element and then outputs a secondary light with a wavelength different from that of the primary light. Specifically, the phosphors can include yttrium-aluminum-garnet activated by cerium, nitrogen-containing calcium aluminosilicate activated by europium and/or chromium, sialon activated by europium, silicate activated by europium, potassium fluosilicate activated by manganese, and the like.

(Adhesive)

An adhesive is a member for bonding the light emitting element to the lead electrode or wiring. The insulating adhesives for use can include an epoxy resin, a silicone resin, or a modified resin thereof, a hybrid resin, or the like. The conductive adhesives for use can include a conductive paste, such as silver, gold, or palladium, a tin-bismuth based, tin-copper based, tin-silver based, or gold-tin based solder, and a wax made of a low-melting point metal.

(Wire 50)

The wire is a conductive wire for connecting the electrode of the light emitting element to the lead electrode or wiring. Specifically, the wire for use can be a metal wire made of gold, copper, silver, platinum, aluminum, or an alloy thereof. In particular, a gold wire is preferable because the gold wire is less likely to be broken due to stress from the sealing member and has excellent heat resistance or the like. To enhance the light reflectivity, at least the surface of the wire may be formed of silver. Note that the reflective film 20 can also be applied to the wire. The reflective film 20 can decrease the size of the silver crystal grain by containing the nanoparticles 25, thereby increasing the strength of the wire.

EXAMPLES

Examples of the present invention will be described in detail below. It is apparent that the present invention is not limited only to the following Examples.

Example 1

In Example 1, a titanium film is deposited in a thickness of 100 nm on a substrate for deposition made of a slide glass (of a separation type) 1-9645-01 manufactured by AS ONE corporation by use of a sputtering device, and then a silver film containing 4.1% by weight of nanoparticles of aluminum oxide is deposited in a thickness of 500 nm as a sample of the reflective film for the light emitting device on the titanium film.

The process conditions are as follows. Before the process, an ultimate pressure in a chamber is set to a high vacuum of 5.0e-4 Pa, thereby removing the remaining gas. Before the deposition, a deposition surface of the substrate is cleaned by the reverse sputtering on the following conditions: RF 250 W, 1 min, a pressure of 0.5 Pa, and Ar 50 sccm. The titanium film is deposited using a titanium target having a diameter $\Phi$ of 4 inches on the following conditions: RF 500 W, 18 min and 35 sec, a pressure of 0.5 Pa, and Ar 50 sccm. An aluminum oxide-containing silver film is deposited by co-sputtering on the following conditions: RF 100 W for an aluminum oxide target having a diameter $\Phi$ of 4 inches; RF 60 W for a silver target having a diameter $\Phi$ of 4 inches; 120 min; a pressure of 0.5 Pa; and Ar 50 sccm. In deposition, a substrate holder is rotated at 6 rpm to be cooled to about the ordinary temperature.

Figure 4:
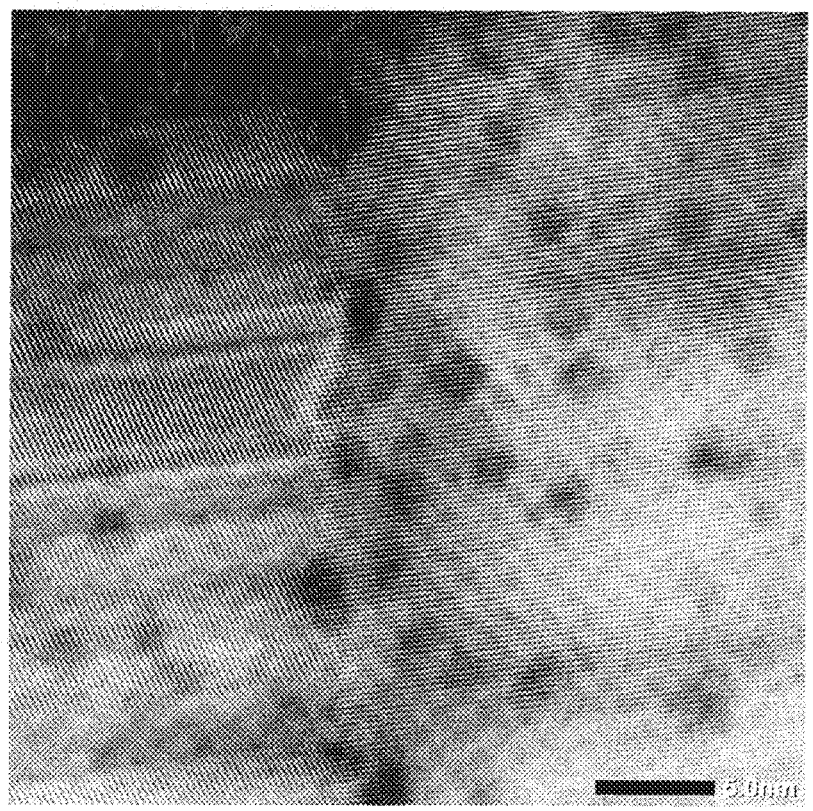
FIG. 4 is an image of one section of a reflective film observed by a scanning transmission electron microscope in one Example of the present invention.

FIG. 4 is an image of one section of the reflective film observed by a scanning transmission electron microscope (JEM-ARM200F (Cold-FEG) manufactured by JEOL Ltd.) in Example 1. As shown in FIG. 4, the reflective film in Example 1 has nanoparticles of aluminum oxide (black spots shown in FIG. 4) existing in the silver crystal grain boundaries. Further, the nanoparticles of aluminum oxide existe in regions other than the silver crystal grain boundaries in the reflective film. The particle diameter of the nanoparticle of aluminum oxide was in a range of about 1.0 nm to 3.0 nm.

Example 2

A sample of Example 2 differs from the sample of Example 1 in that the content of nanoparticles of the aluminum oxide is changed to 2.5% by weight.

Comparative Example 1

A sample of Comparative Example 1 differs from the sample of Example 1 in that a reflective film is fabricated without adding any nanoparticle.

<Evaluation>

In each of the samples of Examples 1, 2, and Comparative Example 1, the reflectivity of the sample was measured before and after a heat treatment (conditions: in the atmosphere, 250° C., and 2 hr). The results of measurements are shown in Table 1.

TABLE 1

|  |  | Example 1 | Example 2 | Comparative Example 1 |
|---|---|---|---|---|
| Content of nanoparticles [% by weight] | | 4.1 | 2.5 | 0 |
| Reflectivity [%] | Before heating | 90.6 | 95.5 | 97.0 |
| | After heating | 89.9 | 94.9 | 90.7 |
| Reflectivity retention rate [%] | | 99.2 | 99.4 | 93.5 |

As shown in Table 1, the reflective film of Examples 1 and 2 hardly changes its reflectivity before and after the heat treatment, and the presence of the nanoparticles of aluminum oxide suppresses the increase in pits and projections on the surface of the reflective film due to the thermal history of the silver film. By controlling the content of nanoparticles, for example, to 4% by weight or less, it can be seen that a high initial reflectivity can be easily obtained, and that the reflectivity can also be easily maintained.

Example 3

A sample of Example 3 differs from the sample of Example 1 in that the nanoparticle is changed to zirconium oxide. The reflective film of Example 3 has a reflectivity before a heat treatment (condition: as above) of 92.6%, another reflectivity after the heat treatment of 89.8%, and a reflectivity retention rate of 97.0%. The reflective film of Example 3 suppresses the reduction in reflectivity between before and after the heat treatment as compared to Comparative Example 1, and the presence of the nanoparticles of zirconium oxide suppresses the increase in pits and projections on the surface of the reflective film due to the thermal history of the silver film.

The light emitting device according to the present invention can be applied to a backlight source for a liquid crystal display, various illumination tools, a large-sized display, various types of display devices dedicated for advertisement, destination guidance, and the like, image readers, such as a digital video camera, a fax machine, a copy machine, or a scanner, and a projector. The reflective film, lead frame, and wiring substrate according to the present invention can be used for such a light emitting device.

DESCRIPTION OF REFERENCE NUMERALS

10 . . . Light emitting element, 20 . . . Reflective film (21 . . . silver crystal grains, 25 . . . Nanoparticle), 30 . . . Lead electrode (Lead frame), 40 . . . Wiring substrate, 50 . . . Wire, 100, 200 . . . Light emitting device

What is claimed is:

1. A light emitting device comprising:
a light emitting element; and
a reflective film for reflecting light from the light emitting element,
wherein the reflective film contains:
silver as a principal component, and
nanoparticles of an oxide, and
wherein the oxide comprises at least one material selected from a group consisting of zirconium oxide, titanium oxide, magnesium oxide, gallium oxide, tantalum oxide, niobium oxide, bismuth oxide, yttrium oxide, iridium oxide, indium oxide, ZTO, IZO, AZO, GZO, and FTO.

2. The light emitting device according to claim 1, wherein the nanoparticles exist at least in a crystal grain boundary of silver.

3. The light emitting device according to claim 2, wherein the oxide is zirconium oxide.

4. The light emitting device according to claim 3, wherein a content of the nanoparticles is 4% by weight or less.

5. The light emitting device according to claim 4, wherein an average particle diameter of the nanoparticle is not less than 0.1 nm nor more than 100 nm.

6. The light emitting device according to claim 5, wherein the silver is polycrystal having a plurality of crystal grains, and wherein the average particle diameter of the crystal grains is not less than 50 nm nor more than 1.0 µm.

7. The light emitting device according to claim 6, wherein a purity of said silver is 91% or more.

8. The light emitting device according to claim 7 further comprising a lead frame, wherein the reflective film is formed on the lead frame.

9. The light emitting device according to claim 7 further comprising a wiring substrate, wherein the reflective film is provided on the wiring substrate.

10. The light emitting device according to claim 7 further comprising a wire connecting the light emitting element, wherein the reflective film is provided on the wire.

11. The light emitting device according to claim 7, wherein either or both of a selenium compound and a sulfur compound is attached to the nanoparticle.

12. The light emitting device according to claim 1, wherein the oxide is at least one material selected from a group consisting of silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, tin oxide, ITO, IZO, AZO, GZO, and FTO.

13. The light emitting device according to claim 1, wherein an average particle diameter of the nanoparticle is not less than 0.1 nm nor more than 100 nm.

14. The light emitting device according to claim 1, wherein a content of the nanoparticles is 4% by weight or less.

15. The light emitting device according to claim 1, wherein either or both of a selenium compound and a sulfur compound is attached to the nanoparticle.

16. The light emitting device according to claim 1, wherein a purity of said silver is 91% or more.

17. The light emitting device according to claim 1, wherein the silver is polycrystal having a plurality of crystal grains, and wherein the average particle diameter of the crystal grains is not less than 50 nm nor more than 1.0 µm.

18. The light emitting device according to claim 1 further comprising a lead frame, wherein the reflective film is formed on the lead frame.

19. The light emitting device according to claim 1 further comprising a wiring substrate, wherein the reflective film is provided on the wiring substrate.

20. The light emitting device according to claim 1 further comprising a wire connecting the light emitting element, wherein the reflective film is provided on the wire.

21. The light emitting device according to claim 1, wherein the oxide is zirconium oxide.

* * * * *